(12) United States Patent
Sreeramaneni et al.

(10) Patent No.: US 10,529,391 B2
(45) Date of Patent: *Jan. 7, 2020

(54) VOLTAGE REFERENCE COMPUTATIONS FOR MEMORY DECISION FEEDBACK EQUALIZERS

(71) Applicant: Micron Technology, Inc., Boise, ID (US)

(72) Inventors: Raghukiran Sreeramaneni, Frisco, TX (US); Jennifer E. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,165

(22) Filed: Jul. 19, 2019

(65) Prior Publication Data
US 2019/0341089 A1 Nov. 7, 2019

Related U.S. Application Data

(63) Continuation of application No. 15/850,965, filed on Dec. 21, 2017, now Pat. No. 10,373,659.

(51) Int. Cl.
| | | |
|---|---|---|
| *G11C 7/10* | (2006.01) | |
| *G11C 7/22* | (2006.01) | |
| *G11C 29/52* | (2006.01) | |
| *G11C 29/02* | (2006.01) | |

(52) U.S. Cl.
CPC .......... *G11C 7/1078* (2013.01); *G11C 7/1006* (2013.01); *G11C 7/1048* (2013.01); *G11C 7/222* (2013.01); *G11C 29/022* (2013.01); *G11C 29/52* (2013.01)

(58) Field of Classification Search
CPC ..... G11C 7/1078; G11C 7/222; G11C 7/1006; G11C 7/1048
USPC .................................. 375/232, 233; 327/243
See application file for complete search history.

(56) References Cited

U.S. PATENT DOCUMENTS

| | | | |
|---|---|---|---|
| 9,130,797 B1 | 9/2015 | Palusa et al. | |
| 10,373,659 B2 * | 8/2019 | Sreeramaneni | G11C 7/1078 |
| 2008/0191772 A1 * | 8/2008 | Pickering | H03K 5/00006 |
| | | | 327/243 |
| 2008/0198916 A1 | 8/2008 | Zeng et al. | |
| 2009/0092180 A1 | 4/2009 | Hollis | |

(Continued)

OTHER PUBLICATIONS

PCT International Search Report & Written Opinion for PCT Application No. PCT/US2018/045845 dated Nov. 26, 2018; 10 Pages.

*Primary Examiner* — Chieh M Fan
*Assistant Examiner* — Fitwi Y Hailegiorgis
(74) *Attorney, Agent, or Firm* — Fletcher Yoder, P.C.

(57) ABSTRACT

A device includes a signal input to receive a data input as part of a bit stream. The device also includes a reference input to receive a reference signal. The device further includes push circuitry to receive a first weight value, receive a first correction value, and generate a push signal based on the first weight value and the first correction value to selectively modify the data input as well as pull circuitry to receive a second weight value, receive a second correction value, and generate a pull signal based on the second weight value and the second correction value to selectively modify the data input.

17 Claims, 11 Drawing Sheets

(56) References Cited

U.S. PATENT DOCUMENTS

2010/0195711 A1     8/2010   Hasan et al.
2011/0188566 A1     8/2011   Beukerna et al.

\* cited by examiner
VOLTAGE REFERENCE COMPUTATIONS FOR MEMORY DECISION FEEDBACK EQUALIZERS

CROSS-REFERENCE TO RELATED APPLICATIONS

The present application is a continuation of U.S. application Ser. No. 15/850,965, entitled "Voltage Reference Computations For Memory Decision Feedback Equalizers," and filed Dec. 21, 2017, now U.S. Pat. No. 10,373,659 which issued on Aug. 6, 2019, the entirety of which is incorporated by reference herein for all purposes.

BACKGROUND

Field of the Invention

Embodiments of the present disclosure relate generally to the field of semiconductor memory devices. More specifically, embodiments of the present disclosure relate to using a decision feedback equalizer (DFE) circuit of a semiconductor memory device to correct distortions in transmitted signals.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Additionally, correcting distortions in the transmitted signals continues to be important. However, conventional distortion correction techniques may not adequately correct the distortions of the signal. Errors that result from slow processes of conventional distortion correction techniques cause additional distortions to the final data, thus reducing the reliability of data transmitted within the memory devices.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Using a feedback equalizer (DFE) of a memory device to perform distortion correction techniques may be valuable, for example, to correctly compensate for distortions in the received data of the memory device. This insures that accurate values are being stored in the memory of the memory device. The DFE may use previous bit data to create corrective values to compensate for distortion resulted from the previous bit data. For example, the most recent previous bit may have more of a distortion effect on the current bit than a bit transmitted several data points before, causing the corrective values to be different between the two bits. With these levels to correct for, the DFE may operate to correct the distortion of the transmitted bit.

In some embodiments, the DFE may require the use of multiple bits of previous data in order to precisely calculate the distortion correction factor. To aid in calculation of tap values to be applied in the DFE, a push-pull DFE summer approach that adds and subtracts current, for example, in a predetermined amount may be utilized in order to maintain constant average common-mode signal (e.g., a constant average common-mode current). This allows the tap response of the DFE to have increased linearity. Use of a push-pull DFE summer may also allow for support of a wide range of tap values, that is, the summer is able to achieve accurate correction when a wide range of tap values for the different taps are combined.

Figure 1:
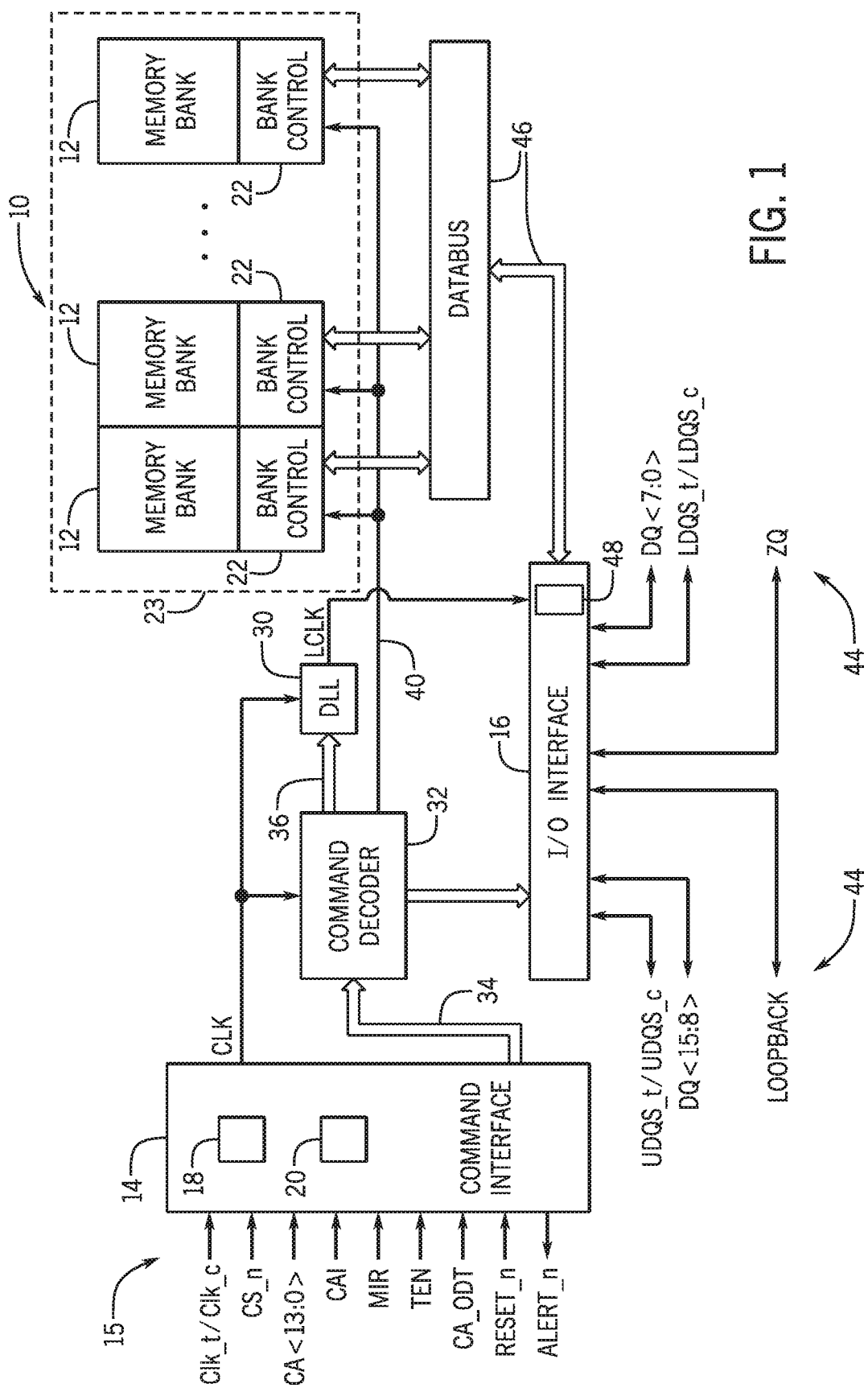
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/ VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
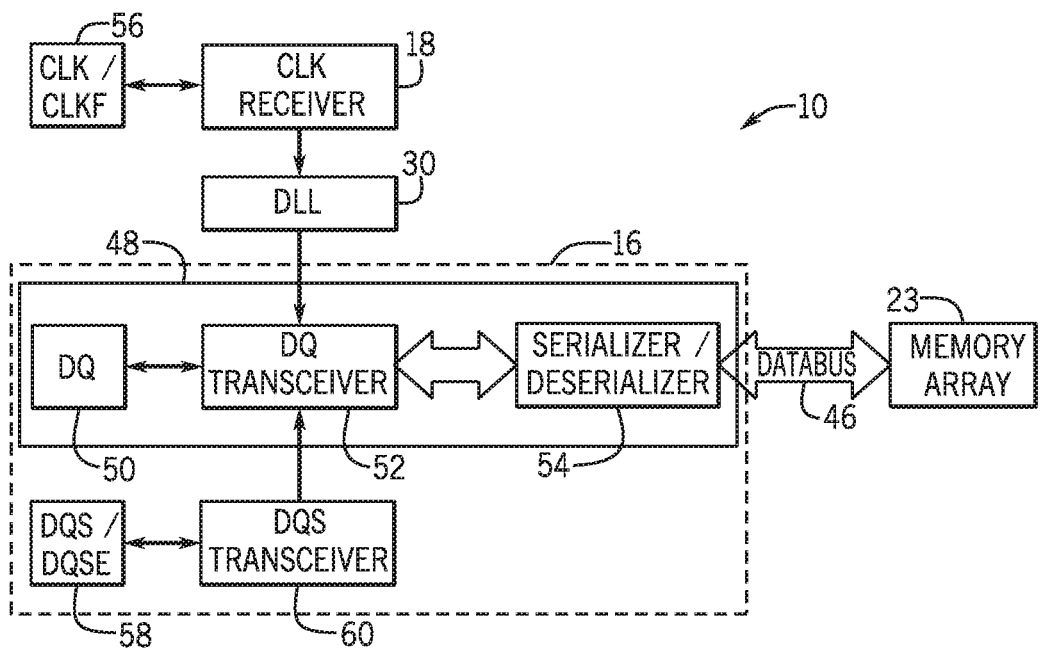
FIG. 2 illustrates a block diagram illustrating a data transceiver of the I/O interface of FIG. 1, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ connector 50, a DQ transceiver 52, and a serializer/deserializer 54. It should be noted that in some embodiments, multiple data transceivers 48 may be utilized that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ connector 50, DQ transceiver 52, and serializer/deserializer 54).

The DQ connector 50 may be, for example a pin, pad, combination thereof, or another type of interface that operates to receive DQ signals, for example, for transmission of data to the memory array 23 as part of a data write operation. Additionally, the DQ connector 50 may operate to transmit DQ signals from the memory device 10, for example, to transmit data from the memory array 23 as part of a data read operation. To facilitate these data reads/writes, a DQ transceiver 52 is present in data transceiver 48. In some embodiments, for example, the DQ transceiver 52 may receive a clock signal generated by the internal clock generator 30 as a timing signal for determining an output timing of a data read operation from the memory array 23. The clock signal transmitted by the internal clock generator 30 may be based upon one or more clocking signals received by the memory device 10 at clock connector 56 (e.g., a pin, pad, the combination thereof, etc.) and routed to the internal clock generator 30 via the clock input circuit 18. Thus, the DQ transceiver 52 may receive a clock signal generated by the internal clock generator 30 as a timing signal for determining an output timing of a data read operation from the memory array 23.

The DQ transceiver 52 of FIG. 2 may also, for example, receive one or more DQS signals to operate in strobe data mode as part of a data write operation. The DQS signals may be received at a DQS connector 60 (e.g., a pin, pad, the combination thereof, etc.) and routed to the DQ transceiver 52 via a DQS transceiver 60 that operates to control a data strobe mode via selective transmission of the DQS signals to the DQ transceiver 52. Thus, the DQ transceiver 52 may receive DQS signals to control a data write operation from the memory array 23.

As noted above, the data transceiver 48 may operate in modes to facilitate the transfers of the data to and from the memory device 10 (e.g., to and from the memory array 23). For example, to allow for higher data rates within the memory device 10, a data strobe mode in which DQS signals are utilized, may occur. The DQS signals may be driven by an external processor or controller sending the data (e.g., for a write command) as received by the DQS connector 58 (e.g., a pin, a pad, the combination thereof, etc.). In some embodiments, the DQS signals are used as clock signals to capture the corresponding input data.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from, for example, a host device having a serial format into a parallel format suitable for storage in the memory array 23. Likewise, the serializer/deserializer 54 operates to translate data received from, for example, the memory array 23 having a parallel format into a serial format suitable for transmission to a host device.

Figure 3:
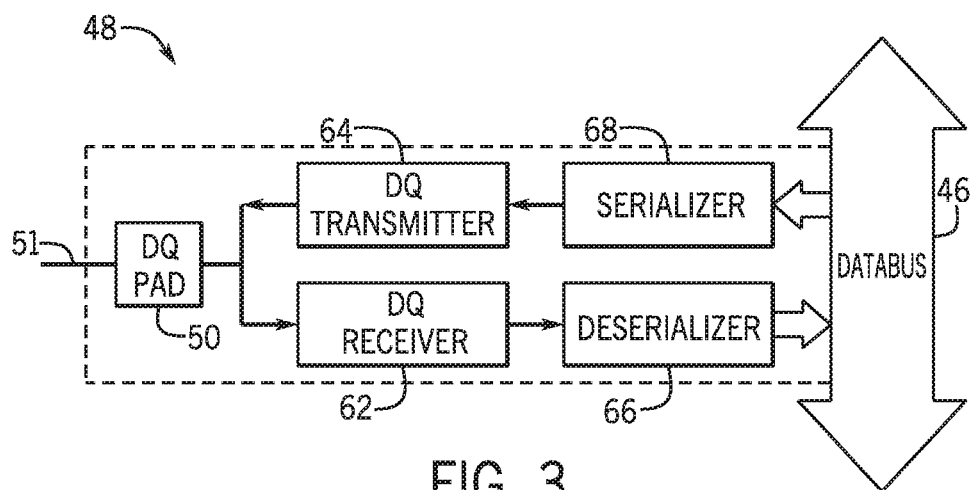
FIG. 3 illustrates a block diagram of an embodiment of the data transceiver of FIG. 2, according to an embodiment of the present disclosure.

FIG. 3 illustrates the data transceiver 48 as including the DQ connector 50 coupled to data transfer bus 51, a DQ receiver 62, a DQ transmitter 64 (which in combination with the DQ receiver 62 forms the DQ transceiver 52), a deserializer 66, and a serializer 68 (which in combination with the deserializer 66 forms the serializer/deserializer 54). In operation, the host (e.g., a host processor or other memory device described above) may operate to transmit data in a serial form across data transfer bus 51 to the data transceiver 48 as part of a data write operation to the memory device 10. This data is received at the DQ connector 50 and transmitted to the DQ receiver 62. The DQ receiver 62, for example, may perform one or more operations on the data (e.g., amplification, driving of the data signals, etc.) and/or may operate as a latch for the data until reception of a respective DQS signal that operates to coordinate (e.g., control) the transmission of the data to the deserializer 66. As part of a data write operation, the deserializer 66 may operate to convert (e.g., translate) data from a format (e.g., a serial form) in which it is transmitted along data transfer bus 51 into a format (e.g., a parallel form) used for transmission of the data to the memory array 23 for storage therein.

Likewise, during a read operation (e.g., reading data from the memory array 23 and transmitting the read data to the host via the data transfer bus 51), the serializer 68 may receive data read from the memory array in one format (e.g., a parallel form) used by the memory array and may convert (e.g., translate) the received data into a second format (e.g., a serial form) so that the data may be compatible with one or more of the data transfer bus 51 and/or the host. The converted data may be transmitted from the serializer 68 to the DQ transmitter 64, whereby one or more operations on the data (e.g., de-amplification, driving of the data signals, etc.) may occur. Additionally, the DQ transmitter 64 may operate as a latch for the received data until reception of a respective clock signal, for example, from the internal clock generator 30, that operates to coordinate (e.g., control) the transmission of the data to the DQ connector 50 for transmission along the data transfer bus 51 to one or more components of the host.

Figure 4:
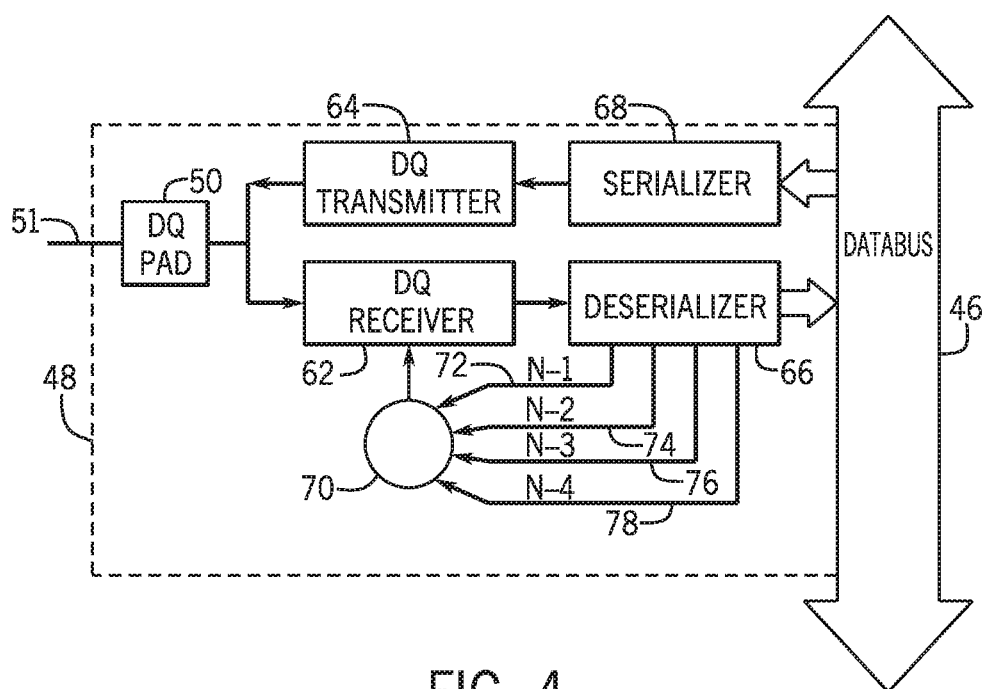
FIG. 4 illustrates a block diagram of a second embodiment of the data transceiver of FIG. 2, according to an embodiment of the present disclosure.

In some embodiments, the data received at the DQ connector 50 may be distorted. For example, data received at the DQ connector 50 may be affected by inter-symbol interference (ISI) in which previously received data interferes with subsequently received data. For example, due to increased data volume being transmitted across the data transfer bus 51 to the DQ connector 50, the data received at the DQ connector 50 may be distorted relative to the data transmitted by the host. One technique to mitigate (e.g., offset or cancel) this distortion and to effectively reverse the effects of ISI is to apply an equalization operation to the data. FIG. 4 illustrates an embodiment of the data transceiver 48 inclusive of an equalizer that may be used in this equalization operation.

FIG. 4 illustrates one embodiment of the data transceiver 48 inclusive of an equalizer, in particular, a decision feedback equalizer (DFE) 70. As illustrated, the DFE 70 is a multi-tap (e.g., four-tap) DFE 70. However, less or more than four taps may be utilized in conjunction with the DFE 70. Likewise, the DFE 70 may be disposed separate from or internal to the deserializer 66 or the DQ receiver 62. In operation, a binary output (e.g., from a latch or decision-making slicer) is captured in one or more data latches or data registers. In the present embodiment, these data latches or data registers may be disposed in the deserializer 66 and the values stored therein may be latched or transmitted along paths 72, 74, 76, and 78.

When a data bit is received at the DQ receiver 62, it may be identified as being transmitted from the host as bit "n" and may be received at a time to as distorted bit n (e.g., bit n having been distorted by ISI). The most recent bit received prior to distorted bit n being received at the DQ receiver 62, e.g., received at time of $t_{-1}$ that immediately precedes time of to, may be identified as n−1 and is illustrated as being transmitted from a data latch or data register along path 72. The second most recent bit received prior to distorted bit n being received at the DQ receiver 62, e.g., received at time of $t_{-2}$ that immediately precedes time of $t_{-1}$, may be identified as n−2 and is illustrated as being transmitted from a data latch or data register along path 74. The third most recent bit received prior to distorted bit n being received at the DQ receiver 62, e.g., received at time of $t_{-3}$ that immediately precedes time of $t_{-2}$, may be identified as n−3 and is illustrated as being transmitted from a data latch or data register along path 76. The fourth most recent bit received prior to distorted bit n being received at the DQ receiver 62, e.g., received at time of $t_{-3}$ that immediately precedes time of $t_{-2}$, may be identified as n−4 and is illustrated as being transmitted from a data latch or data register along path 78. Bits n−1, n−2, n−3, and n−4 may be considered the group of bits that interfere with received distorted bit n (e.g., bits n−1, n−2, n−3, and n−4 cause ISI to host transmitted bit n) and the DFE 70 may operate to offset the distortion caused by the group of bits n−1, n−2, n−3, and n−4 on host transmitted bit n.

Thus, the values latched or transmitted along paths 72, 74, 76, and 78 may correspond, respectively, to the most recent previous data values (e.g., preceding bits n−1, n−2, n−3, and n−4) transmitted from the DQ receiver 62 to be stored in memory array 23. These previously transmitted bits are fed back along paths 72, 74, 76, and 78 to the DFE 70, which operates to generate weighted taps (e.g., voltages) that may be and added to the received input signal (e.g., data received from the DQ connector 50, such as distorted bit n) by means of a summer (e.g., a summing amplifier). In other embodiments, the weighted taps (e.g., voltages) may be combined with an initial reference value to generate an offset that corresponds to or mitigates the distortion of the received data (e.g., mitigates the distortion of distorted bit n). In some embodiments, taps are weighted to reflect that the most recent previously received data (e.g., bit n−1) may have a stronger influence on the distortion of the received data (e.g., distorted bit n) than bits received at earlier times (e.g., bits n−1, n−2, and n−3). The DFE 70 may operate to generate magnitudes and polarities for taps (e.g., voltages) due to each previous bit to collectively offset the distortion caused by those previously received bits.

For example, for the present embodiment, each of previously received bits n−1, n−2, n−3, and n−4 could have had one of two values (e.g., a binary 0 or 1), which was transmitted to the deserializer 66 for transmission to the memory array 23 and, additionally, latched or saved in a register for subsequent transmission along respective paths 72, 74, 76, and 78. In the illustrated embodiment, this leads to sixteen (e.g., $2^4$) possible binary combinations (e.g., 0000, 0001, 0010, . . . , 1110, or 1111) for the group of bits n−1, n−2, n−3, and n−4. The DFE 70 operates to select and/or generate corresponding tap values for whichever of the aforementioned sixteen combinations are determined to be present (e.g., based on the received values along paths 72, 74, 76, and 78) to be used to adjust either the input value received from the DQ connector 50 (e.g., distorted bit n) or to modify a reference value that is subsequently applied to the input value received from the DQ connector 50 (e.g., distorted bit n) so as to cancel the ISI distortion from the previous bits in the data stream (e.g., the group of bits n−1, n−2, n−3, and n−4).

Use of distortion correction (e.g., a DFE 70) may be beneficial such that data transmitted from the DQ connector 50 is correctly represented in the memory array 23 without distortion. Accordingly, it may be useful to store the previous bit data to use in the distortion correction. As illustrated in the block diagram of FIG. 5, a distortion correction circuit 80 may be included as part of the DQ receiver 62 but may not be required to be physically located there (e.g., the distortion correction circuit 80 may instead be coupled to the DQ receiver 62). In some embodiments, the distortion correction circuit 80 may be operated to provide previously transmitted bit data to correct a distorted bit 81 (e.g., bit having been distorted by ISI and/or system distortions) transmitted via a channel 84 (e.g., connection, transmission line, and/or conductive material).

The distorted bit 81 may be transmitted to an amplifying device 82 (e.g., variable gain amplifier) from a channel 84. The distorted bit 81 may be transmitted from the amplifying device 82 to the DFE 70, illustrated as having a single weighted tap 86. The distorted bit 81 may be transmitted simultaneously with a DQ reference signal 83 to the DFE 70. The DQ reference signal 83 may represent a threshold value (e.g., a voltage level) for determination if the transmitted bit received by the DQ connection 50 was a logical low (e.g., 0) or a logical high (e.g., 1).

The DFE 70 may be operated to correct the distortion from the distorted bit 81 using the tap weighted with previous bit data (e.g., n−1 bit data). Data (e.g., logical 1 or logical 0) for an n−1 bit may be transmitted through the path 72. The magnitudes and polarities of the single weighted tap 86 may offset the total distortion caused by the n−1 bit via summer circuit 85, which operates as a current summer that applies current to the distorted bit 81 to offset for distortion caused by the n−1 bit. For example, if the received bit at the DQ connection 50 is determined to be below the DQ reference signal 83, the received bit 81 is transmitted to the memory array 23 as a logical low. The magnitude and polarity of the weighted tap 86 may be able to correct the distorted bit 81 and the DQ reference signal 83.

A modified version of the distorted bit 81 and a modified version of the DQ reference signal 83 may be transmitted to a data latch 94. A corrected bit 88 may be generated via the data latch 94 and transmitted from the data latch 94 to the deserializer 66, which may occur on the rising edge of the DQS signal 96. In other embodiments, variations of the clocking scheme may be followed to be inclusive of additional or alternative methods of data transmission. The value for the new n−1 bit may be stored, for example, in the deserializer 66 for transmission along the path 72 when the corrected bit 88 is received in the deserializer 66. The distortion correction circuitry associated with the DFE 70 and the amplifying device 82 may be described in greater detail below.

Figure 5:
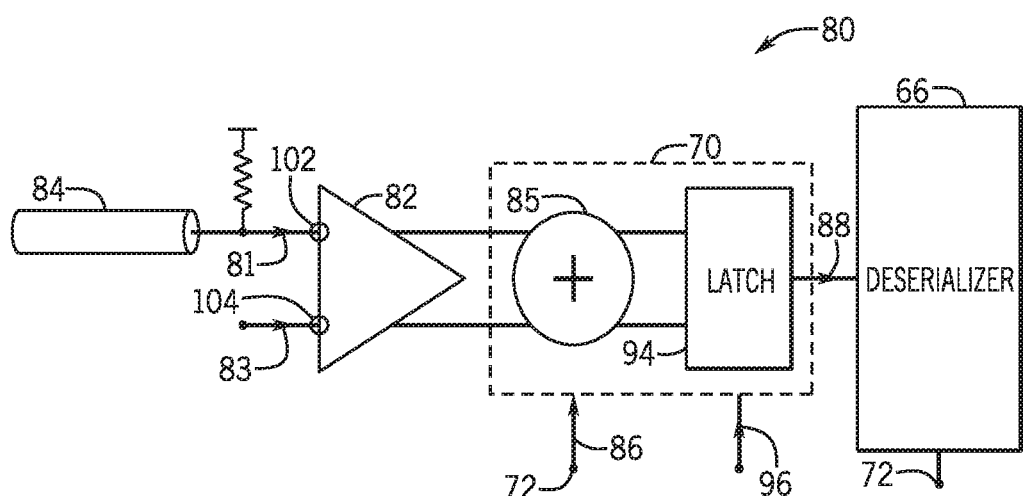
FIG. 5 illustrates a block diagram of a distortion correction circuit, according to an embodiment of the present disclosure.
Figure 6:
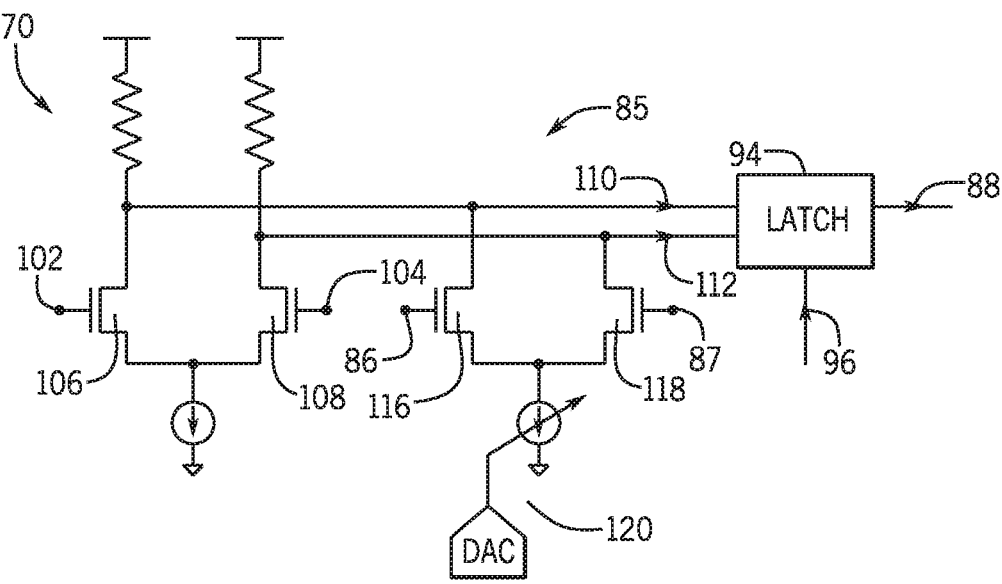
FIG. 6 illustrates a circuit diagram of a portion of the decision feedback equalizer (DFE) of FIG. 5, according to an embodiment of the present disclosure.

FIG. 6 illustrates a circuit diagram of a portion of the DFE 70 of FIG. 5 that may negate distortions associated with the distorted bit 81. Data bits may be received at a first input 102 and a second input 104 to the summer circuit 85. The first input 102 and the second input 104 may be communicatively coupled to a device that may be enabled or disabled (e.g., field effect transistors 106 and 108). The distorted bit 81 may be received by the first input 102 and the DQ reference signal 83 may be received by the second input 104. In this manner, two of the field effect transistors 106 and 108 may be controlled by the distorted bit 81 and the DQ reference signal 83.

The weighted tap 86 and its inverse value (e.g., inverse weighted tap 87) may be transmitted to the outputs 110 and 112 to correct the distortion in the distorted bit 81. A logical high for the n−1 bit is transmitted through the path 72. In this case, the n−1 bit may be implemented to generate the weighted tap 86 and the inverse weighted tap 87 as a control signal for two field effect transistors 116 and 118 enabling the contribution of the weighted tap values 86 and 87 to the outputs 110 and 112.

The weighted tap values 86 and 87 may allow for current to be applied to outputs 110 and 112, whereby the current supplied is controlled through a controllable source 120 (e.g., a current source controlled by a digital to analog converter). The outputs 110 and 112 may be modified values of one or more of the DQ reference signal 83 and the distorted bit 81 and may be transmitted to the data latch 94 (e.g., a regenerative latch or slicer that generates a binary output). The corrected bit 88 may be generated via the data latch 94 based on the outputs 110 and 112 and may be transmitted to the deserializer 66 on the rising edge of the DQS signal 96. The n−1 bit information stored for transmission along the path 72 in the deserializer 66 may be updated with the corrected bit 88 for future distortion corrections.

Figure 7:
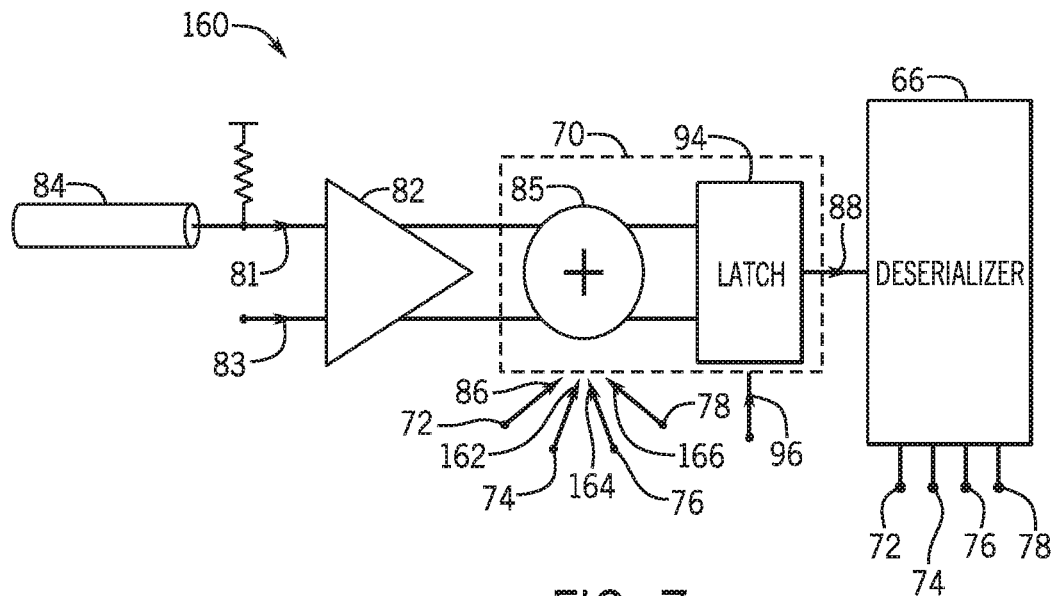
FIG. 7 illustrates a second embodiment of a distortion correction circuit, according to an embodiment of the present disclosure.

In some applications, the corrected bit 88 may need to have a greater level of precision of adjustment than the weighted taps 86 and 87 may provide. FIG. 7 illustrates a block diagram of a distortion correction circuit 160 that may receive four bits of previous data (e.g., n−1 bit data, n−2 bit data, n−3 bit data, and n−4 bit data) to create four weighted taps 86, 162, 164, and 166 to perform a more precise distortion correction to the distorted bit 81. In a similar manner to the distortion correction circuit 80, the distorted bit 81 may be transmitted to the amplifying device 82 via the channel 84. The DQ reference signal 83 may also be transmitted to the amplifying device 82.

From the amplifying device 82, the distorted bit 81 and the DQ reference signal 83 may be transmitted to the DFE 70. Bit data for the previous bits may be transmitted through the paths 72, 74, 76, and 78. The DFE 70 may be operated to correct the distortion from the distorted bit 81 using the four weighted taps 86, 162, 164, and 166 created from the bit data for the four previous bits. The DFE 70 may be operated to generate magnitudes and polarities for each of the weighted taps 86, 162, 164, and 166 for each of the previous bits transmitted along paths 72, 74, 76, and 78 which may be designed to offset the total distortion to the distorted bit 81 caused by the previously received bits.

One or more of a modified version of the distorted bit 81 and a modified version of the DQ reference signal 83 may be transmitted to the data latch 94. The corrected bit 88 may be transmitted to the deserializer 66 on the rising edge of the DQS signal 96 from the data latch 94. The deserializer 66 may be updated with the values for the n−1 bit, n−2 bit, n−3 bit, and the n−4 bit and the values may be stored for transmission along the paths 72, 74, 76, and 78. The distortion correction circuitry associated with the DFE 70 may be described in greater detail below.

Figure 8:
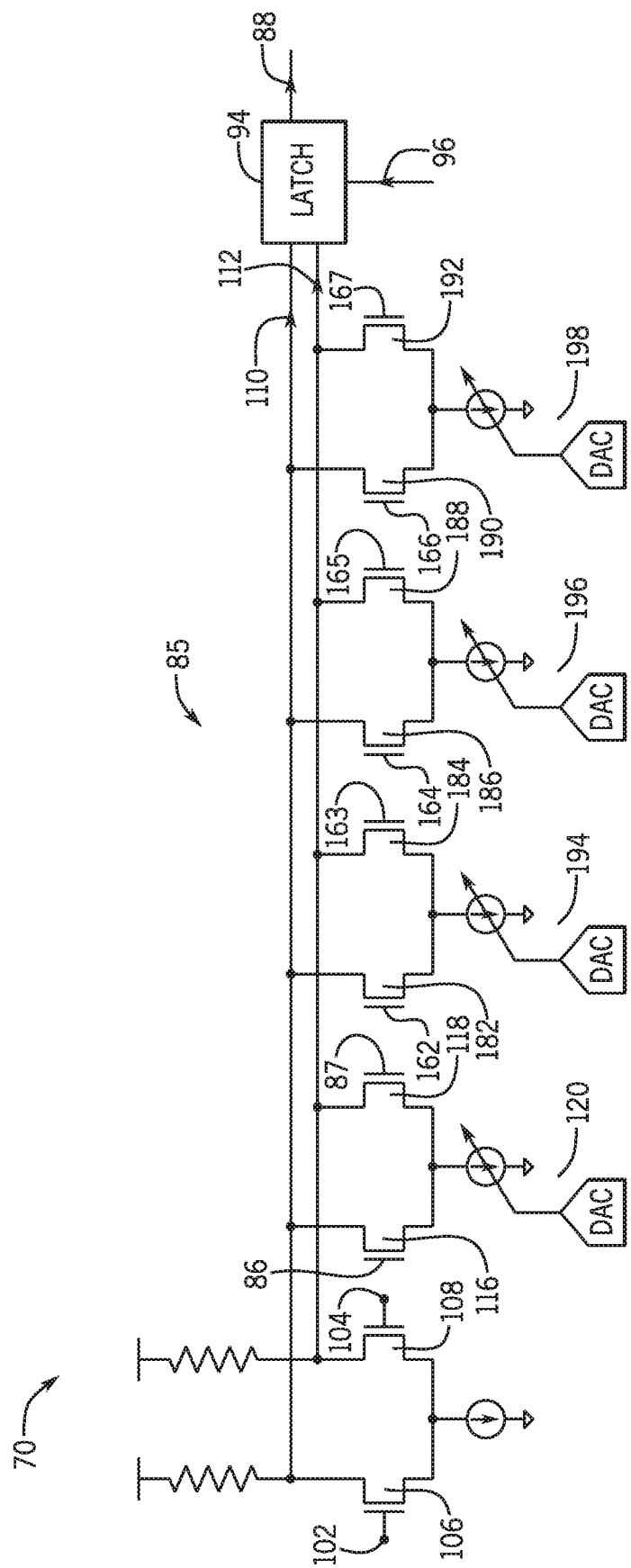
FIG. 8 illustrates a circuit diagram of a portion of the DFE of FIG. 7, according to an embodiment of the present disclosure.

FIG. 8 illustrates a circuit diagram of a portion of the DFE 70 of FIG. 7 that may negate distortions. As additionally illustrated in FIG. 8, the DFE 70 may receive a logical high or low for the n−1 bit, the n−2 bit, the n−3 bit, or the n−4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, and 167 as control signals for the field effect transistors 116, 118, 182, 184, 186, 188, 190, and 192 to control outputs therefrom transmitted to the outputs 110 and 112. The field effect transistors 116, 118, 182, 184, 186, 188, 190, and 192 may be selectively and controllably activated to reflect one of the sixteen (e.g., $2^4$) different possible binary states represented by the various combinations of previously corrected bits (e.g., 0000, 0001, 0010, . . . , 1111).

The weighted tap 86, 87, 162, 163, 164, 166 and 167 values may be applied to the outputs 110 and 112, whereby the current supplied is controlled through the controllable source 120 and additional controllable sources 194, 196, and 198 (e.g., a current source controlled by a digital to analog converter). The outputs 110 and 112 may be transmitted to the data latch 94. The corrected bit 88 may be generated via the data latch 94 based upon the outputs 110 and 112 and may be transmitted to the deserializer 66 on the rising edge of the DQS signal 96. The n−1 bit, the n−2 bit, the n−3 bit, and the n−4 bit information stored for transmission along the paths 72, 74, 76, and 78 in the deserializer 66 may be updated with the corrected bit 88 (e.g., n−4 bit will update to reflect n−3 data, n−3 bit will update to reflect n−2 data, n−2 data will update to reflect n−1 data, and n−1 data will update with the newly corrected bit) for future distortion corrections.

Figure 9:
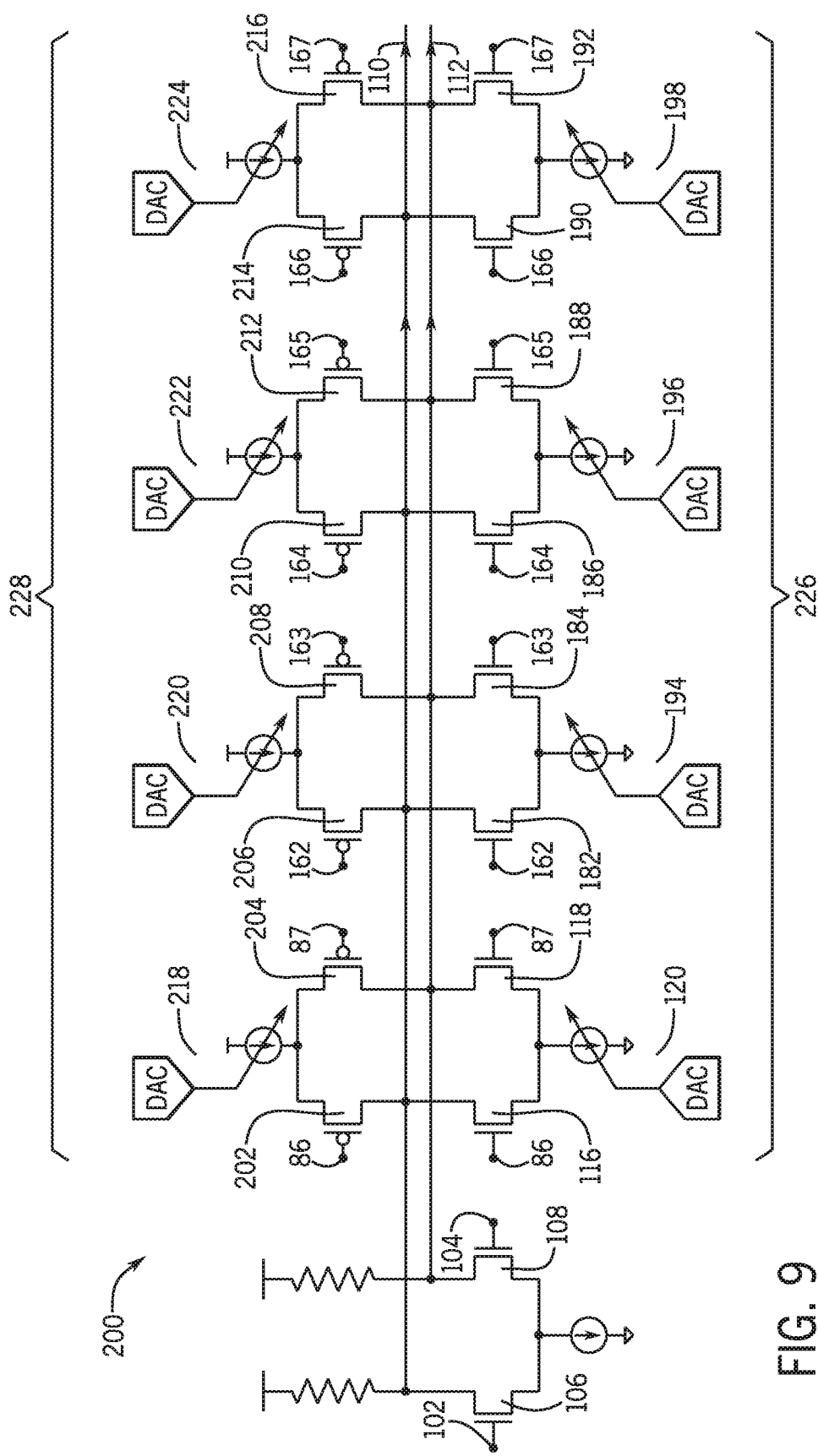
FIG. 9 illustrates a second circuit diagram of a portion of the DFE of FIG. 7, according to an embodiment of the present disclosure.

In some embodiments, tap corrections in conjunction with the summer circuit 85 described above utilize differential pairs of transistors that create imbalance in the summer that may be proportional to a set value. The imbalance may be, for example, created by a pulldown transistor enabled on only one side of the differential pair of transistors based on the sign of correction required. However, in some embodiments, as the common-mode signal (e.g., a common-mode current) of the summer circuits 85 changes across operation conditions, the impact of the analog value set by the respective a controllable sources (e.g., the current sources controlled by the digital to analog converters) may not remain constant i.e. the tap response from the summer circuit 85 becomes non-linear. Accordingly, in some embodiments, a push-pull summer approach that adds and subtracts current in predetermined amounts (e.g., in equal measure) may be utilized to maintain a consistent average common-mode signal, which allows the tap response to be much more linear. For example, as illustrated in FIG. 9, a push-pull summer 200 (e.g., a push-pull summation circuit) may be utilized to accomplish DFE correction in place of the summer circuit 85 of the DFE 70. The push-pull summer 200 includes pull circuitry 226 and push circuitry 228 to add and subtract current from the summer in order to maintain a constant average common-mode signal. In some embodiments, the push-pull summer 200 may add or subtract current in equal amounts, however it might also be useful to add or subtract current in unequal amounts if that results in a more linear tap response.

Accordingly, FIG. 9 illustrates a circuit diagram of a portion of the DFE 70 of FIG. 7 that may negate distortions via use of the push-pull summer 200 in place of summer circuit 85. The push-pull summer 200 contains pull circuitry 226 and push circuitry 228. The pull circuitry 226 operates generally similarly to what was described above with respect to FIG. 8. However, the push-pull summer 200 utilizes both of the pull circuitry 226 and push circuitry 228 to adjust current in predetermined amounts (e.g., in equal measure) may be utilized to maintain a consistent average common-mode signal, which allows the tap response to be much more linear. A DFE 70 having the push-pull summer 200 of FIG. 9 may receive a logical high or low for the n–1 bit, the n–2 bit, the n–3 bit, or the n–4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, 167 as control signals for the field effect transistors 116, 118, 182, 184, 186, 188, 190, 192 as well as for the control signals for the field effect transistors 202, 204, 206, 208, 210, 212, 214, and 216 to control outputs therefrom transmitted to the outputs 110, 112. Field effect transistors 182, 184, 186, 188, 190, and 192 are part of the pull circuitry 226, while field effect transistors 202, 204, 206, 208, 210, 212, 214, and 216 are part of the push circuitry 228. The field effect transistors 182, 184, 186, 188, 190, 192, 202, 204, 206, 208, 210, 212, 214, and 216 of the push-pull summer 200 may be selectively and controllably activated to reflect one of the sixteen (e.g., $2^4$) different possible binary states represented by the various combinations of previously corrected bits (e.g., 0000, 0001, 0010 . . . 1111).

The weighted taps 86, 87, 162, 163, 164, 166 and 167 values may be applied to the outputs 110 and 112, whereby the current supplied is controlled through the controllable source 120 and additional controllable sources 194, 196, 198, 218, 220, 222, and 224 (e.g., a current source controlled by a digital to analog converter). The outputs 110 and 112 may be transmitted to a data latch, such as data latch 94. The controllable sources 218 and 120 may both supply current to the same weighted taps 86 and 87, however this may be supplied through different circuits (i.e., 120 supplies current to the pull circuitry 226 and 218 supplies current to the push circuitry 228), whereby the supplied currents may have equal or unequal values depending on the linear response of the DFE 70. The push-pull summer 200 may operate to add and subtract the supplied currents in equal measure from the differential nodes (e.g., the connection points with the outputs 110 and 112 of the pull circuitry 226 and push circuitry 228) in order to maintain constant average common-mode signal. This may allow for the various tap responses to have improved linearity.

For example, if the pull circuitry 226 operates alone (e.g., if the push circuitry 228 is not present), the DFE 70 may operate as described generally with respect to FIG. 8. That is, weighted tap 86 and its inverse value (e.g., inverse weighted tap 87) may be transmitted to the outputs 110 and 112 to correct the distortion in the distorted bit 81. A logical high for the n–1 bit is transmitted through the path 72. In this case, the n–1 bit may be implemented to generate the weighted tap 86 and the inverse weighted tap 87 as a control signal for two field effect transistors 116 and 118 enabling the contribution of the weighted tap values 86 and 87 to the outputs 110 and 112. For example, if the correction due to the n–1 bit is, for example, 50 mV, if the pull circuitry 226 operates alone (e.g., if the push circuitry 228 is not present), all of the correction to be applied with respect to weighted tap 86 and its inverse value (e.g., inverse weighted tap 87) comes from the differential pair of field effect transistors 116 and 118. However, by using the pull circuitry 226 in conjunction with the push circuitry 228, if the correction due to the n–1 bit is, for example, 50 mV, the pull circuitry 226 may operate to effect 25 mV of correction to be applied from the differential pair of field effect transistors 116 and 118 and 25 mV of correction to be applied from the differential pair of field effect transistors 202 and 204.

Additionally, non-equal values may instead be applied in pull circuitry 226 in conjunction with the push circuitry 228. For example, a 25% correction may be applied from a differential pair of field effect transistors in the pull circuitry 226 and a 75% correction may be applied from a differential pair of field effect transistors in the push circuitry 228 corresponding to the differential pair of field effect transistors in the pull circuitry 226, a 20% correction may be applied from a differential pair of field effect transistors in the pull circuitry 226 and a 80% correction may be applied from a differential pair of field effect transistors in the push circuitry 228 corresponding to the differential pair of field effect transistors in the pull circuitry 226, a 75% correction may be applied from a differential pair of field effect transistors in the pull circuitry 226 and a 25% correction may be applied from a differential pair of field effect transistors in the push circuitry 228 corresponding to the differential pair of field effect transistors in the pull circuitry 226, a 80% correction may be applied from a differential pair of field effect transistors in the pull circuitry 226 and a 20% correction may be applied from a differential pair of field effect transistors in the push circuitry 228 corresponding to the differential pair of field effect transistors in the pull circuitry 226, or additional ratios may be utilized as desired to maintain consistency of the common-mode signal generated by the DFE 70. Similarly, equal ratio or differing ratio values currents may be applied to 194 and 220, 196 and 222, and 198 and 224. The corrected bit 88 may be generated via the data latch 94 based upon the outputs 110 and 112 and may be transmitted to the deserializer 66 on the rising edge of the DQS signal 96. The n–1 bit, the n–2 bit, the n–3 bit, and the n–4 bit information stored for transmission along the paths 72, 74, 76, and 78 in the deserializer 66 may be updated utilizing the corrected bit 88 (e.g., n–4 bit will update to reflect n–3 data, n–3 bit will update to reflect n–2 data, n–2 data will update to reflect n–1 data, and n–1 data will update with the newly corrected bit) for future distortion corrections.

In some embodiments, a first bit stream may be transmitted to the channel 84 at t=0. Enough time may not have passed between the transmission of an n−1 bit prior in time to the distorted bit 81 (e.g., the "n bit") to allow for calculation of the distortion contribution of the n−1 bit to the distorted bit 81. If this occurs, one solution may be to wait for the n−1 bit information to complete transmitting to the deserializer 66 so it may be used in the distortion calculation. However, another technique may alternatively be applied.

At a time t=1 (after time t=0), the distorted bit 81 may have been received by the channel 84 and DFE calculations thereon may have begun while a second distorted bit n+1 is received by the channel 84, such that enough time may have passed to allow for the n−1 bit to be known to the deserializer 66 (e.g., stored therein), but the n−1 corrected bit may not yet have been applied to aid in the correction determination of the value of the distorted bit 81. At a third time t=2 (after time t=1), a third distorted bit n+2 may be received at the channel 84, however, not enough time may have passed for the distorted bit 81 to become the corrected bit 88 and to be received in the deserializer 66 as information to correct the distortion of the second distorted bit 280. Thus, as with the distorted bit 81 received at t=0, the distortion calculation must wait until the corrected bit 88 is received in the deserializer 66 and transmitted for distortion correction of the second distorted bit n+1. There may exist a more time efficient solution than waiting for correction of the distorted bits 81, n+1, and n+2, etc. without performing any additional processes during the waiting time.

Figure 10:
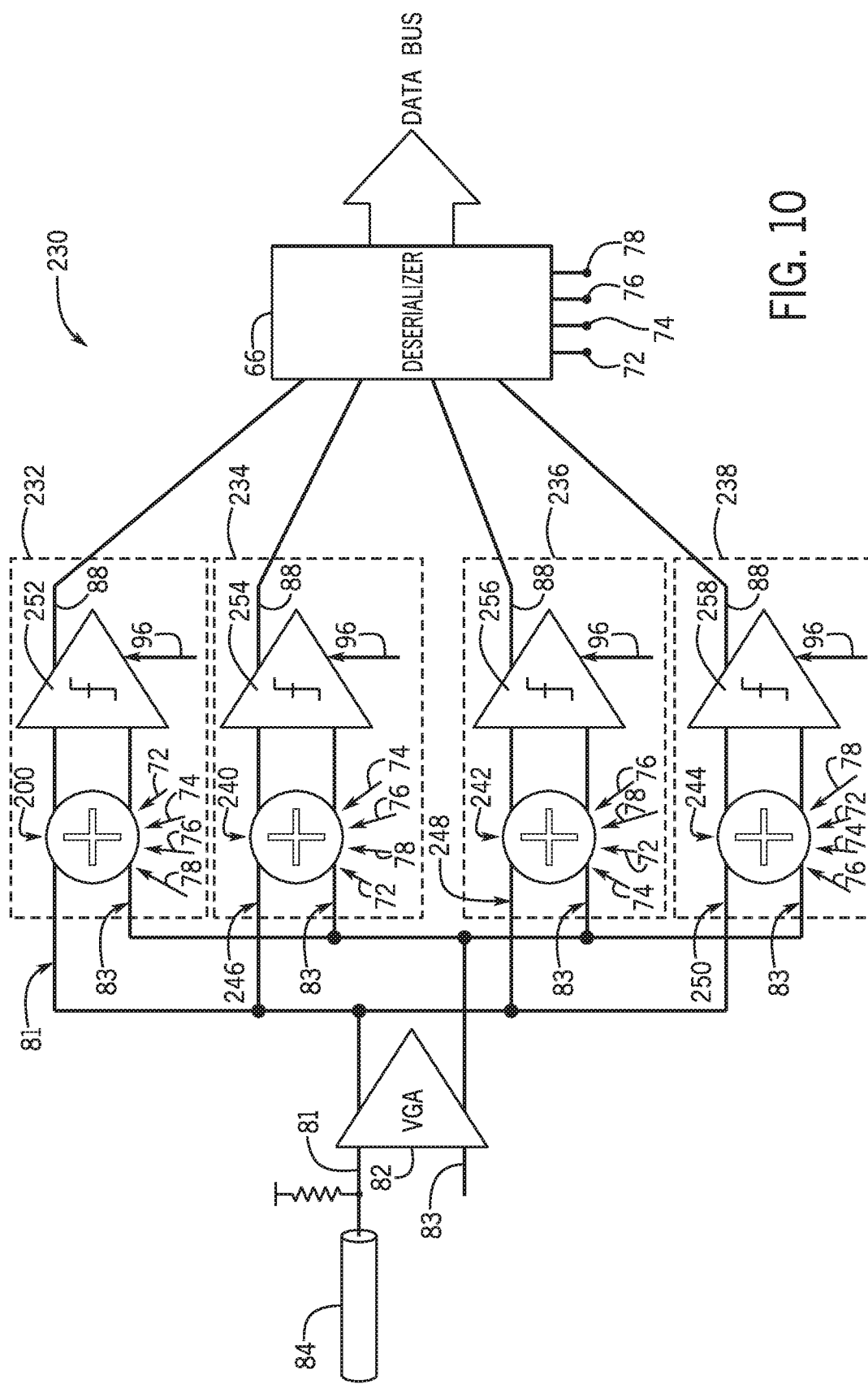
FIG. 10 illustrates a third embodiment of a distortion correction circuit, according to an embodiment of the present disclosure.

Indeed, it may be desired to compensate for limited transmission bandwidth at the DQ receiver 62. The solution may lie in adding duplicates of the equalizers to allow for rapid computing of distortion correction values. In some embodiments, to increase bandwidth at the DQ receiver 62, duplicate equalizers (e.g., at least two of the DFE 70 utilizing the push-pull summer 200 in place of summer circuit 85) may be utilized. One embodiment implementing duplicate equalizers is illustrated in FIG. 10, with distortion correction circuit 230 utilizing DFE 232, DFE 234, DFE 236, and DFE 238 (e.g., as equalizers that may allow for rapid computing of distortion correction values that each operate with the push-pull summer 200 in place of summer circuit 85 of FIG. 7). While duplication of four equalizers are illustrated to compensate for transmission bandwidth limitations, it should be appreciated that two, three, five or more equalizers may be implemented in a manner similar to that described herein with respect to the four equalizers illustrated in FIG. 10.

As illustrated, the distortion correction circuit 230 may be capable of processing four data bits each at a four bit distortion correction level via the DFE 232, DFE 234, DFE 236, and DFE 238, which are similar to the DFE 70 described in FIG. 7 with the push-pull summer 200, 240, 242, and 244 used respectively in place of summer circuit 85, as described above with respect to FIG. 9. In this manner, the summer circuits 200, 240, 242, and 244 of FIG. 10 may operate in the manner described above with respect to the push-pull summation circuit of FIG. 9.

To compensate for limited transmission bandwidth, a method of rolling distorted bits of a received bit stream between the DFE 232, DFE 234, DFE 236, and DFE 238 may be followed as a method of alleviating a backup of distorted bits resulting from limited transmission bandwidth. In this way, as the distorted bit 81 of a received bit stream is being processed in the DFE 232 in a first iteration of distortion correction, a second distorted bit 246 may be received in the DFE 234 to start a second iteration of distortion correction. This allows the second iteration of distortion correction to occur while the first iteration of distortion correction is completing. Likewise, as the second distorted bit 246 of the received bit stream is being processed in the DFE 234 in a second iteration of distortion correction (which may coincide with the first distorted bit 81 being processed in the DFE 232 in a first iteration of distortion correction), a third distorted bit 248 may be received in the DFE 236 to start a third iteration of distortion correction. Similarly, as the third distorted bit 248 of the received bit stream is being processed in the DFE 236 in a third iteration of distortion correction (which may coincide with the second distorted bit 246 being processed in the DFE 234 in a second iteration of distortion correction or may coincide with the second distorted bit 246 being processed in the DFE 234 in a second iteration of distortion correction and the distorted bit 81 being processed in the DFE 232 in a first iteration of distortion correction), a fourth distorted bit 250 may be received in the DFE 238 to start a fourth iteration of distortion correction.

In some embodiments, the first iteration of distortion correction may be completed before a fifth distorted bit is received via the channel 84, which allows the fifth distorted bit to be rolled back to the DFE 232 for a fifth of distortion correction. Likewise, the second iteration of distortion correction may be completed before a sixth distorted bit is received via the channel 84, which allows the sixth distorted bit to be rolled back to the DFE 234 for a sixth distortion correction, and so forth. In this manner, the DFE 232, DFE 234, DFE 236, and DFE 238 may be utilized in conjunction with a rolling DFE correction technique. That is, the distorted bit 81 of a bit stream received from channel 84 may be received by the DFE 232, a second distorted bit 246 of the bit stream may be received by the DFE 234, a third distorted bit 248 of the bit stream may be received by the DFE 236, a fourth distorted bit 250 of the bit stream may be received by the DFE 238, and a fifth distorted bit may be rolled back to be received by the DFE 232 once the first iteration of the distortion correction is complete.

To elaborate further, the DFE 232 may receive the distorted bit 81 and the voltage correction signal 83 (for example, having been amplified by amplifier 82) and may process the distorted bit 81 using the method described above with respect to the distortion correction circuit 160 of FIG. 7 having the push-pull summer 200, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 200. It may be important to note that the previous bits may be stored for transmission along the paths 72, 74, 76, and 78 in any order as long as during the distortion correction, the proper previous bit order is observed (e.g., n−1 bit as the most significant bit and the n−4 bit as the least significant bit). Once generated, the corrected bit 88 of the data latch 252 may be transmitted on the rising edge of the DQS signal 96 to the deserializer 66 to update, for example, the n−1 bit location of the deserializer 66.

Additionally, as illustrated, the inputs used for the final decision of the corrected bit 88 for the DFE 234 may be different from the inputs for the DFE 232. DFE 234 may receive a second distorted bit 246 and may processing it after the distorted bit 81 is received (e.g., while distorted bit 81 is having its distortion corrected in the DFE 232). The method described above with respect to the distortion correction circuit 160 having the push-pull summer 200, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 200 may be used in processing of the second distorted bit 246. However, as illustrated, the previous bit or weighted tap data transmitted along the paths 72, 74, 76, and 78 may be shifted with respect to the inputs to the DFE 232 to take into account that the distorted bit 81 corrected into corrected bit 88 by the DFE 232 becomes the n−1 bit value for the DFE 234. Once generated, the corrected bit 88 of the data latch 254 may be transmitted on the rising edge of the DQS signal 96 to the deserializer 66 to update, for example, the n−1 bit location of the deserializer 66 (e.g., moving the corrected bit 88 from the DFE 232 to the n−2 bit location).

Likewise, the inputs used for the final decision of the corrected bit 88 for the DFE 236 may be different from the inputs for the DFE 232 and DFE 234. DFE 236 may receive a third distorted bit 248 and may processing it after the distorted bits 81 and 246 are received (e.g., while distorted bits 81 and 246 are having their distortion corrected in the DFE 232 and DFE 234, respectively). The method described above with respect to the distortion correction circuit 160 having the push-pull summer 200, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 200 may be used in processing of the third distorted bit 248. However, as illustrated, the previous bit or weighted tap data transmitted along the paths 72, 74, 76, and 78 may be shifted with respect to the inputs to the DFE 232 and the DFE 234 to take into account that the distorted bits 81 and 246 corrected into respective corrected bits 88 by the DFE 232 and DFE 234 become the n−2 bit value and the n−1 bit value for the DFE 236. Once generated, the corrected bit 88 of the data latch 256 may be transmitted on the rising edge of the DQS signal 96 to the deserializer 66 to update, for example, the n−1 bit location of the deserializer 66 (e.g., moving the corrected bit 88 from the DFE 232 to the n−3 bit location and moving the corrected bit 88 from the DFE 234 to the n−2 bit location).

Similarly, the inputs used for the final decision of the corrected bit 88 for the DFE 238 may be different from the inputs for the DFE 232, the DFE 234, and the DFE 236. DFE 238 may receive a fourth distorted bit 250 and may processing it after the distorted bits 81, 246, and 248 are received (e.g., while distorted bits 81, 246, and 248 are having their distortion corrected in the DFE 232, 234, and 236, respectively). The method described above with respect to the distortion correction circuit 160 having the push-pull summer 200, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 200 may be used in processing of the fourth distorted bit 250. However, as illustrated, the previous bit or weighted tap data transmitted along the paths 72, 74, 76, and 78 may be shifted with respect to the inputs to the DFE 232, 234, and 236 to take into account that the distorted bits 81, 246, and 248 corrected into respective corrected bits 88 by the DFE 232, 234, and 236 become the n−3 bit value, the n−2 bit value, and the n−1 bit value for the DFE 238. Once generated, the corrected bit 88 of the data latch 258 may be transmitted on the rising edge of the DQS signal 96 to the deserializer 66 to update, for example, the n−1 bit location of the deserializer 66 (e.g., moving the corrected bit 88 from the DFE 232 to the n−4 bit location and moving the corrected bit 88 from the DFE 234 to the n−3 bit location, and moving the corrected bit 88 from the DFE 236 to the n−2 bit location).

The outputs 88 from the data latches 252, 254, 256, and 258 from the DFE 232, 234, 236, and 238 may be sent to the deserializer 66 at the conclusion of each final decision on the corrected bit 88. As noted above, in the deserializer 66, the n−1 bit, the n−2 bit, the n−3 bit, and the n−4 bit may be used to update the data stored in the deserializer 66 for transmission along the paths 72-78 in accordance with the corrected bit 88 data (e.g., the corrected bit 88 from the each of the DFE 232, 234, 236, and 238 shifted as a new corrected bit 88 is received). It may be noted that this rolling method of DFE correction may allow for greater throughput of the bit stream received while still allowing for distortion correction of the received bits of the bit stream.

Figure 11:
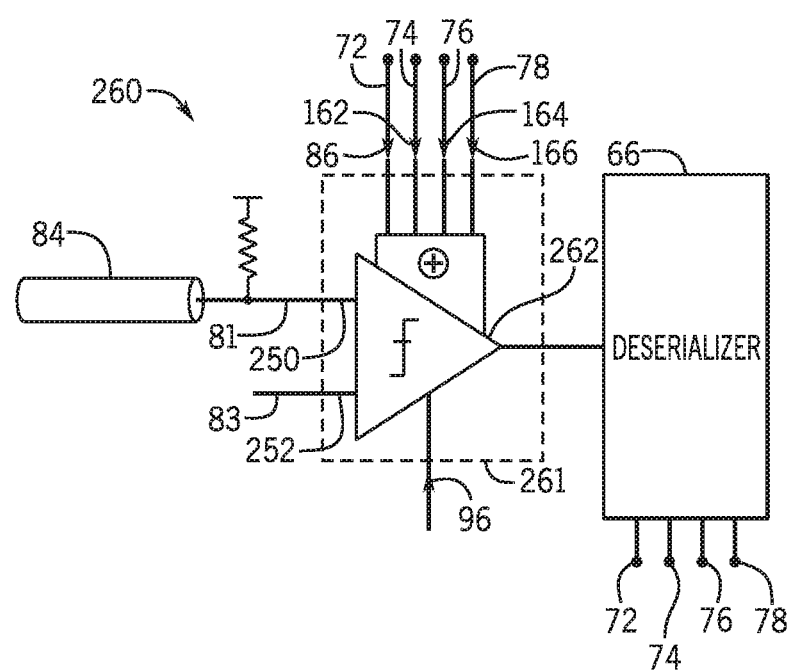
FIG. 11 illustrates a fourth embodiment of a distortion correction circuit, according to an embodiment of the present disclosure.

FIG. 11 illustrates a block diagram of a distortion correction circuit 260 that may receive four bits of previous data (e.g., n−1 bit data, n−2 bit data, n−3 bit data, and n−4 bit data) to create four weighted taps 86, 162, 164, and 166 to perform a more precise distortion correction to the distorted bit 81. In a similar manner to the distortion correction circuit 160, the distorted bit 81 may be transmitted via the channel 84. However, as illustrated, the amplifying device 82 of FIG. 7 may be eliminated in connection with the distortion correction circuit 260 of FIG. 11. Elimination of this amplifying device 82 may allow, for example, increased bandwidth transmission of a bit stream that includes the distorted bit 81 in the DQ receiver 62 by elimination of the amplifying device that may otherwise slow reception of the bit stream that includes the distorted bit 81.

Instead, the distorted bit 81 and the DQ reference signal 83 may be transmitted to the DFE 261 at inputs 250 and 252, respectively. Bit data for the previous bits may be transmitted through the paths 72, 74, 76, and 78. The DFE 261 may be operated to correct the distortion from the distorted bit 81 using the four weighted taps 86, 162, 164, and 166 created from the bit data for the four previous bits. The DFE 261 may be operated to generate magnitudes and polarities for each of the weighted taps 86, 162, 164, and 166 for each of the previous bits transmitted along paths 72, 74, 76, and 78 which may be designed to offset the total distortion to the distorted bit 81 caused by the previously received bits.

One or more of a modified version of the distorted bit 81 and a modified version of the DQ reference signal 83 may be transmitted to a data latch portion of the DFE 261. The corrected bit 88 may be transmitted to the deserializer 66 on the rising edge of the DQS signal 96 from the data latch portion of the DFE 261. The deserializer 66 may be updated with the values for the n−1 bit, n−2 bit, n−3 bit, and the n−4 bit and the values may be stored for transmission along the paths 72, 74, 76, and 78. The distortion correction circuitry associated with the DFE 261 may be described in greater detail below.

Figure 12:
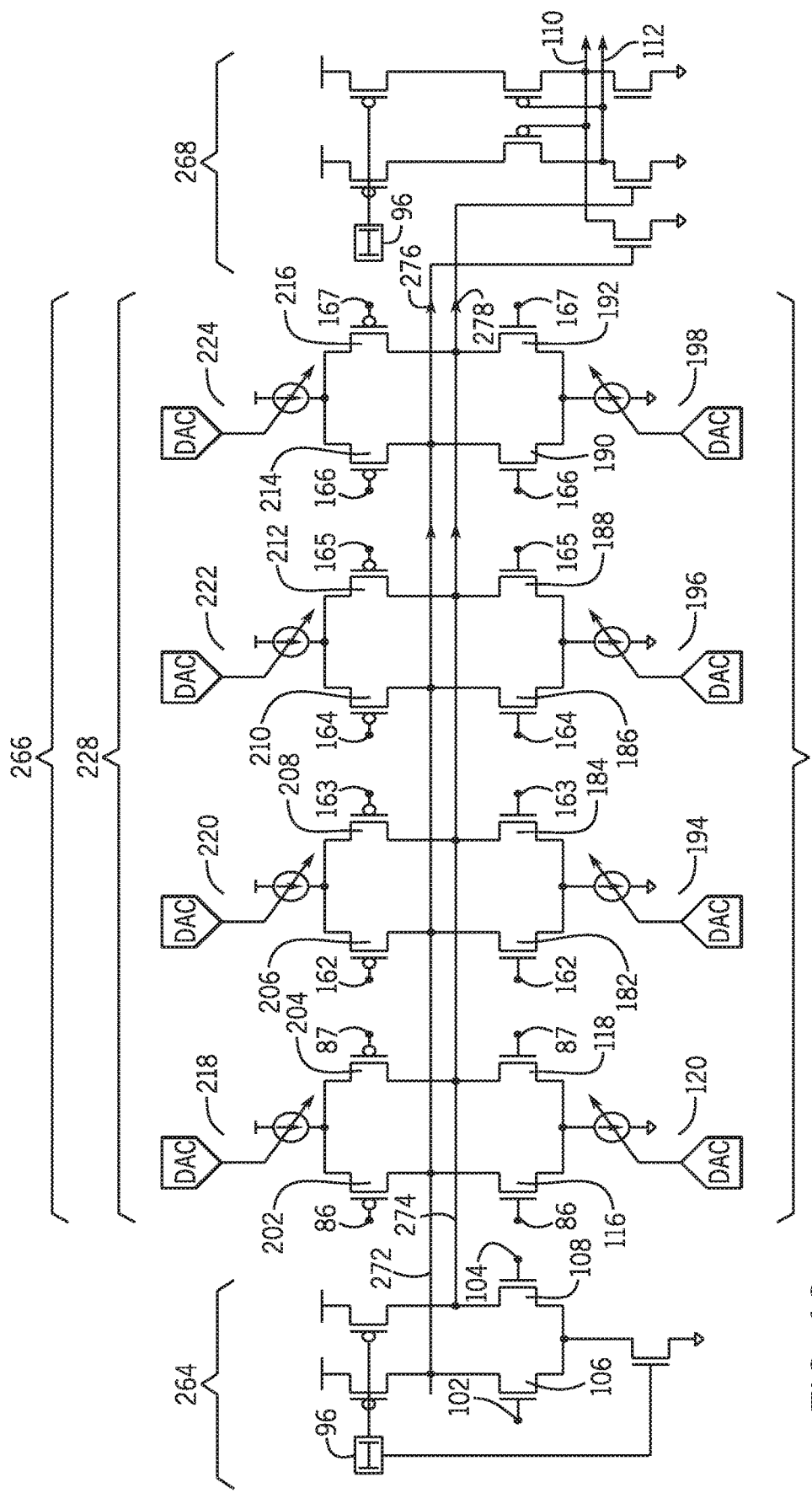
FIG. 12 illustrates a circuit diagram of a portion of the DFE in FIG. 11, according to an embodiment of the present disclosure.

FIG. 12 illustrates a circuit diagram of the equalizer or DFE 261 (e.g., regenerative latch circuitry and DFE circuitry such as summer circuitry combined or integrated into one device) of FIG. 10 that may negate distortions while utilizing the push-pull summer 200. It should be appreciated by one of ordinary skill in the art that additional stages result in reduced bandwidth. The circuit diagram 264 of the DFE 261 includes three portions: a first portion 266, a second portion 268, and a third portion 270.

In the first portion 266 (e.g., a first portion of a regenerative comparator or a regenerative latch), data bits may be received at a first input 102 and a second input 104 to the equalizer 261. The first input 102 and the second input 104 may be communicatively coupled to a device that may be enabled or disabled (e.g., field effect transistors 106 and 108). The distorted bit 81 may be received at the first input 102 and the DQ reference signal 83 may be received at the second input 104. In this manner, two of the field effect transistors 106 and 108 may be controlled by the distorted bit 81 and the DQ reference signal 83. Data outputs 272 and 274 from field effect transistors 106 and 108 are sent to the second portion 268 based on the DQS signal 96 as a clock signal of the first portion 260 that operates to track the input voltages applied at input 202 and input 104 as the DQS signal, for example, transitions high.

The second portion 266 of the circuit diagram of the equalizer 261 generally applies weighted tap values to the outputs from the first portion 264 and, accordingly, operates generally as a summer circuit (e.g., a summing amplifier). The second portion 266 includes the pull circuitry 226 and the push circuitry 228. The pull circuitry 226 operates similarly to what was described above with respect to FIG. 9. The second portion 268 utilizes both of the pull circuitry 226 and push circuitry 228 to adjust current in predetermined amounts (e.g., in equal measure) may be utilized to maintain a consistent average common-mode signal, which allows the tap response to be much more linear. The DFE 261 may receive a logical high or low for the n−1 bit, the n−2 bit, the n−3 bit, or the n−4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, 167 as control signals for the field effect transistors 116, 118, 182, 184, 186, 188, 190, 192 as well as for the control signals for the field effect transistors 202, 204, 206, 208, 210, 212, 214, and 216 to control outputs therefrom transmitted to the outputs 110, 112. Field effect transistors 182, 184, 186, 188, 190, and 192 are part of the pull circuitry 226, while field effect transistors 202, 204, 206, 208, 210, 212, 214, and 216 are part of the push circuitry 228. The field effect transistors 182, 184, 186, 188, 190, 192, 202, 204, 206, 208, 210, 212, 214, and 216 of the push-pull summer 200 may be selectively and controllably activated to reflect one of the sixteen (e.g., $2^4$) different possible binary states represented by the various combinations of previously corrected bits (e.g., 0000, 0001, 0010 . . . 1111).

The weighted taps 86, 87, 162, 163, 164, 166 and 167 values may be applied to the outputs 110 and 112, whereby the current supplied is controlled through the controllable source 120 and additional controllable sources 194, 196, 198, 218, 220, 222, and 224 (e.g., a current source controlled by a digital to analog converter). The outputs 276 and 278 may be transmitted to the third portion 268 (e.g., a second portion of a regenerative comparator or a regenerative latch). In the third portion 268, a feedback may be applied, for example, as the DQS signal as goes low, to be output from the third portion 268, for example, as the DQS signal 96 goes high again. The corrected bit 88 may be generated via the equalizer 261 based upon the outputs 110 and 112 and may be transmitted to the deserializer 66 on the rising edge of the DQS signal 96. In this manner, the first portion 264 and the third portion 268 operate as a regenerative latch in a manner similar to the data latch 94 with the second portion 266 operating as a summer circuit that operates in a manner similar to summer circuit 85 to generate the corrected bit 88. The n−1 bit, the n−2 bit, the n−3 bit, and the n−4 bit information stored for transmission along the paths 72, 74, 76, and 78 in the deserializer 66 may be updated with the corrected bit 88 (e.g., n−4 bit will update to reflect n−3 data, n−3 bit will update to reflect n−2 data, n−2 data will update to reflect n−1 data, and n−1 data will update with the newly corrected bit) for future distortion corrections.

The controllable sources 218 and 120 which both supply current to the same weighted taps 86 and 87, however through different circuits (i.e., 120 supplies current to the pull circuitry 226 and 218 supplies current to the push circuitry 228), may have equal or unequal currents, depending on the linear response of the DFE 261. In this manner, for example, the push-pull summer 200 may operate to add and subtract current in equal measure from the differential nodes (e.g., the connection points with the outputs 110 and 112 of the pull circuitry 226 and push circuitry 228) in order to maintain constant average common-mode signal. This may allow for the various tap responses to have improved linearity.

For example, if the pull circuitry 226 operates alone (e.g., if the push circuitry 228 is not present), the DFE 261 may operate as described generally with respect to FIG. 8. That is, weighted tap 86 and its inverse value (e.g., inverse weighted tap 87) may be transmitted to the outputs 110 and 112 to correct the distortion in the distorted bit 81. A logical high for the n−1 bit is transmitted through the path 72. In this case, the n−1 bit may be implemented to generate the weighted tap 86 and the inverse weighted tap 87 as a control signal for two field effect transistors 116 and 118 enabling the contribution of the weighted tap values 86 and 87 to the outputs 110 and 112. For example, if the correction due to the n−1 bit is, for example, 50 mV, if the pull circuitry 226 operates alone (e.g., if the push circuitry 228 is not present), all of the correction to be applied with respect to weighted tap 86 and its inverse value (e.g., inverse weighted tap 87) comes from the differential pair of field effect transistors 116 and 118. However, by using the pull circuitry 226 in conjunction with the push circuitry 228, if the correction due to the n−1 bit is, for example, 50 mV, the pull circuitry 226 may operate to effect 25 mV of correction to be applied from the differential pair of field effect transistors 116 and 118 and 25 mV of correction to be applied from the differential pair of field effect transistors 202 and 204.

Figure 13:
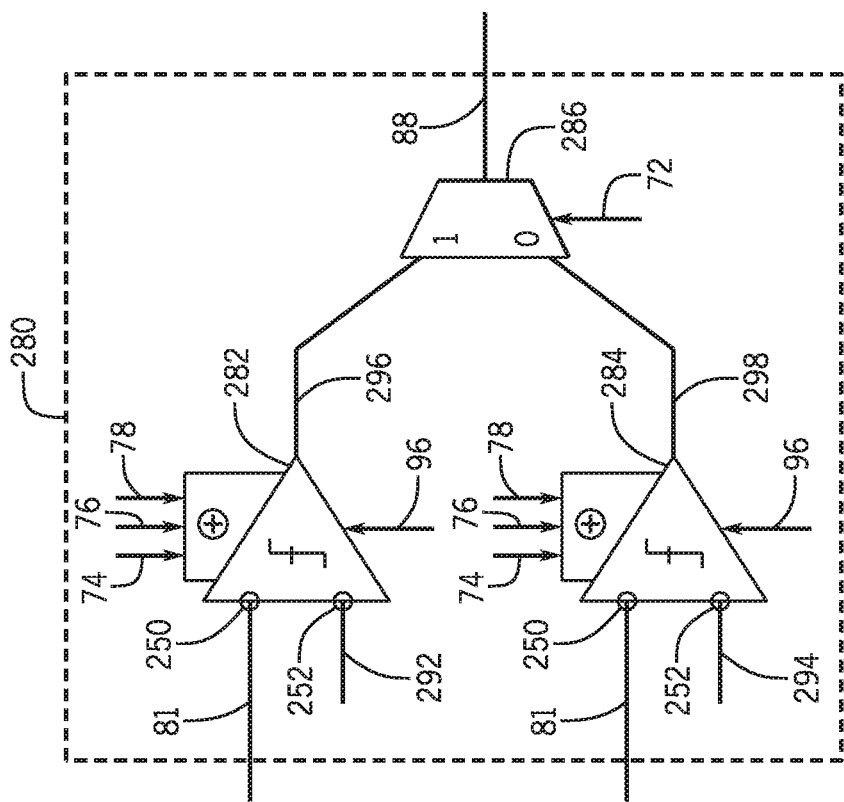
FIG. 13 illustrates a fifth embodiment of the distortion correction circuit, according to an embodiment of the present disclosure.

One solution to delays in processing that may occur with respect to the distortion correction circuit 242 may include calculating the distortion contribution of the n−2 bit, the n−3 bit, and the n−4 bit using both possibilities of values of the n−1 bit (e.g., logical high and logical low) and discarding the calculated value that utilized the incorrect value of the n−1 bit when that value is determined. FIG. 13 illustrates a distortion correction circuit 280 which may implement this solution.

FIG. 13 illustrates a block diagram of the distortion correction circuit 280 which may implement an efficient solution for handling data transmitted faster than otherwise may be processed. Additionally, the distortion correction circuit 280 may be utilized separate from the inclusion of any amplifying device 82. The distortion correction circuit 280 includes a first equalizer 282 and a second equalizer 284, each of which may operate generally as described above with respect to DFE 261, as well as a selection device 286 (e.g., a multiplexer). The distorted bit 81 may be transmitted to the input 250 of the first equalizer 282 as well as to the input 250 of the second equalizer 284.

The input 252 of the first equalizer 282 also receives a voltage correction signal 292 and the input 252 of the second equalizer receives a voltage correction signal 294. The voltage correction signal 292, transmitted to the equalizer 282, may be different than the voltage correction signal 294, transmitted to the equalizer 284. The equalizer 282 may receive the voltage correction signal 292 as the DQ reference signal 83 as modified by an amount of adjustment related to the most recently received bit n−1 corresponding to a logical high. Similarly, the equalizer 284 may receive the voltage correction signal 294 as the DQ reference signal 83 as modified by an amount of adjustment related to the most recently received bit n−1 corresponding to a logical low.

The equalizers 282 and 284 may correct the distortion associated with the distorted bit 81, using the three inputs using the previous bit or weighted tap data transmitted along the paths 74, 76, and 78 to calculate the value necessary with the equalizer. This may be done in such a way that the output 296 from the equalizer 282 represents the corrected bit 88 with the n−1 bit as a logical high while the output 298 from the equalizer 284 represents the corrected bit 88 if the n−1 bit is a logical low. Thus, each of the equalizer 282 and the equalizer 284 may operate in a manner similar to the portion of the equalizer 261 of FIG. 11 with one difference; only three paths that may negate distortions are utilized (e.g., corresponding to bits n−2, n−3, and n−4) with their respective weighted taps and current supplied via three respective controllable sources.

Once outputs 296 and 298 are transmitted to the selection device 286, enough time will have passed for the n−1 bit to have been determined, stored, and transmitted from the deserializer 66, such that the selection device 286 can receive the value transmitted along path 72 as a selection control signal (e.g., a multiplexer selection or control signal). The n−1 bit value transmitted along the path 72 may be used to select the corrected bit from the outputs 296 and 298. If the n−1 bit is logical high, the output 296 may be selected as being the corrected bit 88. However, if the n−1 bit is logical low, the output 298 may be selected as being the corrected bit 88. The output from the selection device 286 may be sent to the deserializer 66 as the corrected bit 88. In the deserializer 66, the n−1 bit, the n−2 bit, the n−3 bit, and the n−4 bit may be updated in accordance with the corrected bit 88 (e.g., n−4 bit will update to reflect n−3 data, n−3 bit will update to reflect n−2 data, n−2 data will update to reflect n−1 data, and n−1 data will update with the newly corrected bit 88). It may be noted that the corrected bit 88 may not complete transmission and updating of all values prior to the reception of the second distorted bit 218, thus the method as described above utilizing dual calculations of the corrected bit value based upon contributions from the n−1 bit being both logically high and logically low may be repeated.

Figure 14:
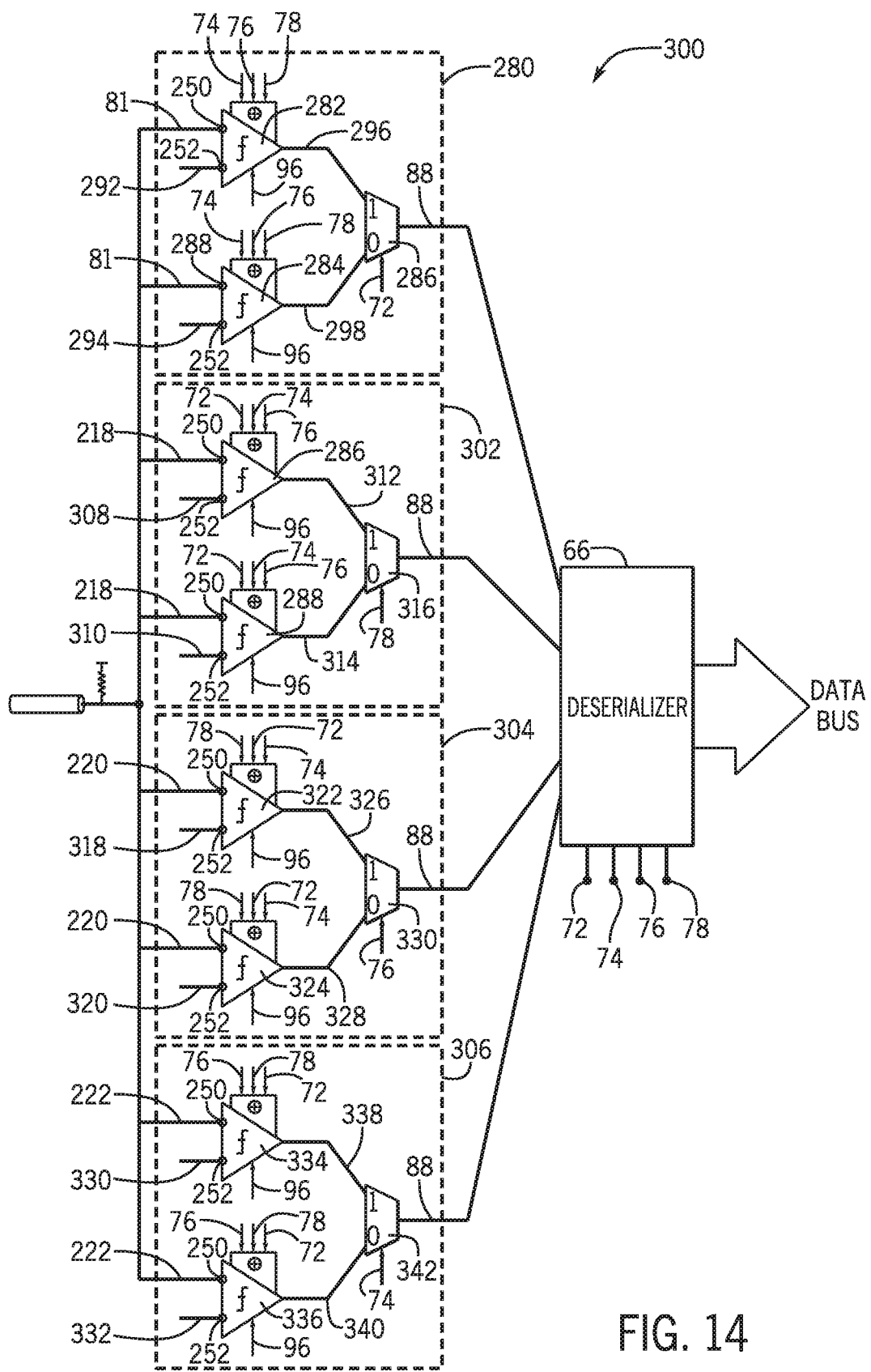
FIG. 14 illustrates a sixth embodiment of the distortion correction circuit, according to an embodiment of the present disclosure.

FIG. 14 illustrates the distortion correction circuit 300 which may be capable of processing four data bits at a four bit distortion correction level, and includes the distortion correction circuit 280, a second circuit 302, a third circuit 304, and a fourth circuit 306, which may be distortion correction circuits similar to the distortion correction circuit 280 with modification to their respective inputs. Distorted bit 81 may be received by the first circuit 280, a second distorted bit 218 may be received by the second circuit 302, a third distorted bit 220 may be received by the third circuit 304, a fourth distorted bit 222 may be received by the fourth circuit 306, and a fifth distorted bit may be rolled back to be received by the first circuit 280 once the first iteration of the distortion correction is complete.

To elaborate further, the first circuit 280 may receive the distorted bit 81 and may begin to process it using the method described with the distortion correction circuit 280, using the previous bit or weighted tap data transmitted along the paths 74, 76, and 78 to calculate the values necessary to supply the equalizers 282 and 284. The voltage correction signals 292 and 294 may represent a modified DQ reference signal 83 having been adjusted for the contribution of a bit value for n−1 being logically high and low, respectively, and may be utilized in the correction of the distorted bit 81. Outputs 296 and 298 to the selection device 286 may be transmitted on the rising edge of the DQS signal 96. The selection device 286 may use the n−1 bit value stored in the deserializer 66 and transmitted along path 72 to make the final decision on which value the corrected bit 88 value takes (e.g., that of output 296 or output 298).

The inputs used for the determination of the corrected bit 88 for the second circuit 302 may be different from the inputs for the first circuit 280. The second circuit 302 may receive the second distorted bit 218 and may begin processing of the second distorted bit 218 in parallel with each of the voltage correction signal 308 as the DQ reference signal 83 modified by an amount of adjustment related to the most recently received bit value transmitted along path 78 corresponding to a logical high and the voltage correction signal 310 as the DQ reference signal 83 modified by an amount of adjustment related to the most recently received bit value transmitted along path 78 corresponding to a logical low. The method described with the distortion correction circuit 280 may be used to correct the distorted bit 218, except that the previous bit or weighted tap data transmitted along the paths 72, 74, and 76 may be used to calculate the values necessary to provide a correction to the equalizers 286 and 288. Outputs 312 and 314 to the selection device 316 may be transmitted on the rising edge of the DQS signal 96. The selection device 316 for the second circuit 302 may use the bit value stored in the deserializer 66 for transmission along path 78 to make the final decision on the corrected bit 88 value of the second distorted bit 218.

The inputs used for the determination of the corrected bit 88 for the third circuit 304 may be different from the inputs for the second circuit 302. The third circuit 304 may receive the third distorted bit 220 and may begin processing of the third distorted bit 220 in parallel with each of the voltage correction signal 318 as the DQ reference signal 83 modified by an amount of adjustment related to the most recently received bit value transmitted along path 76 corresponding to a logical high and the voltage correction signal 320 as the DQ reference signal 83 modified by an amount of adjustment related to the most recently received bit value transmitted along path 76 corresponding to a logical low. The method described with the distortion correction circuit 280 may be used to correct the distorted bit 220, except that the previous bit or weighted tap data transmitted along the paths 72, 74, and 78 may be used to calculate the values necessary to provide a correction to the equalizers 322 and 324. Outputs 326 and 328 to the selection device 312 may be transmitted on the rising edge of the DQS signal 96. The selection device 330 for the third circuit 282 may use the bit value stored in the deserializer 66 for transmission along path 76 to make the final decision on the corrected bit 88 value of the third distorted bit 220.

The inputs used for the determination of the corrected bit 88 for the fourth circuit 306 may be different from the inputs for the third circuit 304. The fourth circuit 306 may receive the fourth distorted bit 222 and may begin processing of the fourth distorted bit 222 in parallel with each of the voltage correction signal 330 as the DQ reference signal 83 modified by an amount of adjustment related to the most recently received bit value transmitted along path 74 corresponding to a logical high and the voltage correction signal 332 as the DQ reference signal 83 modified by an amount of adjustment related to the most recently received bit value transmitted along path 74 corresponding to a logical low. The method described with the distortion correction circuit 280 may be used to correct the distorted bit 222, except that the previous bit or weighted tap data transmitted along the paths 72, 76, and 78 may be used to calculate the values necessary to provide a correction to the equalizers 334 and 336. Outputs 338 and 340 to the selection device 342 may be transmitted on the rising edge of the DQS signal 96. The selection device 342 for the fourth circuit 306 may use the bit value stored in the deserializer 66 for transmission along path 74 to make the final decision on the corrected bit 88 value of the fourth distorted bit 222.

The output from the selection devices 286, 316, 330, and 342 may be sent to the deserializer 66 at the conclusion of each final decision on the corrected bit 88. In the deserializer 66, the n−1 bit, the n−2 bit, the n−3 bit, and the n−4 bit may be used to update the data stored in the deserializer 66 for transmission along the paths 72-78 in accordance with the corrected bit 88 data. It may be noted that the corrected bit 88 may not have completed transmission to the deserializer 66, nor updated values stored for transmission along the paths 72-78 prior to the reception of the fifth distorted bit, thus the method of delaying the final selection of the corrected bit 88 may be continued. Thus, the first circuit 280 may apply weighted values from the fourth circuit 306 in parallel until the corrected bit 88 is determined from the fourth circuit 306 and used as a selection bit for the first circuit 280. Similarly, the second circuit 302 may apply weighted values from the first circuit 280 in parallel until the corrected bit 88 is determined from the first circuit 280 and is used as a selection bit for the second circuit 302. Likewise, the third circuit 304 may apply weighted values from the second circuit 302 in parallel until the corrected bit 88 is determined from the second circuit 302 and is used as a selection bit for the third circuit 304. The fourth circuit 306 may apply weighted values from the third circuit 304 in parallel until the corrected bit 88 is determined from the third circuit 304 and is used as a selection bit for the fourth circuit 306.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a signal input configured to receive a data input as part of a bit stream;
a reference input configured to receive a reference signal;
push circuitry configured to:
receive a first weight value;
receive a first correction value;
generate a push signal based on the first weight value and the first correction value to selectively modify the data input; and
generate a push reference signal based on the first weight value and the first correction value to selectively modify the reference signal; and
pull circuitry configured to:
receive a second weight value;
receive a second correction value;
generate a pull signal based on the second weight value and the second correction value to selectively modify the data input; and
generate a pull reference signal based on the second weight value and the second correction value to selectively modify the reference signal.

2. The device of claim 1, wherein the push signal is generated to modify the input signal by a first amount and the pull signal is generated to modify the data input by a second amount.

3. The device of claim 2, wherein the first amount is greater than the second amount.

4. The device of claim 2, wherein the second amount is greater than the first amount.

5. The device of claim 1, wherein the push signal and the pull signal are generated to modify the data input to generate a modified data input to offset inter-symbol interference from the bit stream on the data input.

6. The device of claim 5, comprising a data latch configured to generate a corrected bit based at least in part on the modified data input.

7. The device of claim 6, wherein the data latch comprises an input to receive a clocking signal.

8. The device of claim 7, wherein the data latch is configured to utilize the clocking signal to output the corrected bit.

9. The device of claim 8, comprising a deserializer coupled to the data latch, wherein the deserializer is configured to receive the corrected bit from the data latch.

10. The device of claim 9, wherein the deserializer comprises a data location configured to store an indication of the corrected bit.

11. The device of claim 10, wherein the deserializer is configured to transmit the indication of the corrected bit from the data location to generate the first weight value and the second weight value.

12. The device of claim 11, wherein the device utilizes the indication of the correction bit to generate one or more of the first weight value, the first correction value, the second weight value, or the second correction value.

13. The device of claim 10, wherein the deserializer comprises a second data location, wherein the deserializer is configured to receive an indication of a second corrected bit from the data latch, wherein the deserializer is configured to store the indication of the corrected bit in the second data location and overwrite the indication of the corrected bit in the data location with the indication of the second corrected bit in the data location.

14. A device, comprising:
a signal input configured to receive a data input as part of a bit stream;
a first adjustment circuit coupled to the signal input and configured to receive the data input, wherein the first adjustment circuit comprises:
push circuitry configured to generate a push signal as a first current source to selectively modify the data input to compensate for inter-symbol interference of the data input bit due to a previously received data input of the bit stream; and pull circuitry configured to generate a pull signal as a second current source to selectively modify the data input to compensate for the inter-symbol interference of the data input bit due to the previously received data input of the bit stream; and a second adjustment circuit coupled to the signal input, wherein the signal input is configured to receive a second data input as part of the bit stream, wherein the second adjustment circuit is configured to receive the second data input from the signal input, wherein the second adjustment circuit comprises:

second push circuitry configured to generate a second push signal as a third current source to selectively modify the second data input to compensate for inter-symbol interference of the second data input bit due to the previously received data input of the bit stream; and second pull circuitry configured to generate a second pull signal as a fourth current source to selectively modify the second data input to compensate for the inter-symbol interference of the second data input bit due to the previously received data input of the bit stream.

15. The device of claim 14, comprising a deserializer configured to store an indication of a value of the previously received data input and transmit the indication to the first adjustment circuit and the second adjustment circuit.

16. A method, comprising:
receiving a data input as part of a bit stream;
receiving a first weight value;
receiving a first correction value;
generating a push signal based on the first weight value and the first correction value to selectively modify the data input;
generating a push reference signal based on the first weight value and the first correction value to selectively modify a reference signal;
receiving a second weight value;
receiving a second correction value;
generating a pull signal based on the second weight value and the second correction value to selectively modify the data input; and
generating a pull reference signal based on the second weight value and the second correction value to selectively modify the reference signal.

17. The method of claim 16, comprising generating the push signal to modify the input signal by a first amount and generating the pull signal to modify the data input by a second amount.

* * * * *